US009484420B2

(12) United States Patent
Kang et al.

(10) Patent No.: US 9,484,420 B2
(45) Date of Patent: Nov. 1, 2016

(54) THIN FILM TRANSISTOR SUBSTRATE, LIQUID CRYSTAL DISPLAY HAVING SAME, AND METHOD OF MANUFACTURING THE SAME

(75) Inventors: Su-Hyoung Kang, Bucheon-si (KR); Yoonho Khang, Yongin-si (KR); Sangho Park, Suwon-si (KR); Jungkyu Lee, Seoul (KR); Chong Sup Chang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 710 days.

(21) Appl. No.: 13/544,751

(22) Filed: Jul. 9, 2012

(65) Prior Publication Data
US 2013/0027627 A1  Jan. 31, 2013

(30) Foreign Application Priority Data

Jul. 25, 2011 (KR) .................. 10-2011-0073671

(51) Int. Cl.
| G02F 1/136 | (2006.01) |
| H01L 29/786 | (2006.01) |
| H01L 21/336 | (2006.01) |
| H01L 29/417 | (2006.01) |
| H01L 27/12 | (2006.01) |
| G02F 1/1368 | (2006.01) |

(52) U.S. Cl.
CPC ....... *H01L 29/41733* (2013.01); *H01L 27/124* (2013.01); *H01L 29/78642* (2013.01); *H01L 29/78696* (2013.01); *G02F 1/1368* (2013.01)

(58) Field of Classification Search
USPC ........................................................ 349/46
See application file for complete search history.

(56) References Cited

U.S. PATENT DOCUMENTS

| 5,917,210 | A  * | 6/1999 | Huang et al. ................. 257/292 |
| 7,560,752 | B2 * | 7/2009 | Akamatsu et al. ........... 257/192 |
| 2006/0152644 | A1* | 7/2006 | Yi .................................... 349/42 |
| 2006/0170048 | A1* | 8/2006 | Chiu et al. .................... 257/347 |
| 2008/0296574 | A1* | 12/2008 | Cheng .............. G02F 1/136209 257/59 |
| 2009/0009677 | A1* | 1/2009 | Yamazaki et al. .............. 349/43 |
| 2011/0013106 | A1* | 1/2011 | Liu ................................. 349/46 |

\* cited by examiner

*Primary Examiner* — Ryan Crockett
(74) *Attorney, Agent, or Firm* — H.C. Park & Assoicates, PLC

(57) ABSTRACT

A display apparatus includes a thin film transistor substrate, a substrate facing the thin film transistor substrate, and a liquid crystal layer. The thin film transistor substrate includes an insulating substrate, a gate electrode disposed on a surface of the insulating substrate, a gate insulating layer covering the gate electrode, a semiconductor layer disposed on the gate insulating layer, a source electrode disposed on the semiconductor layer, and a drain electrode disposed on the semiconductor layer and spaced apart from the source electrode. One of the source electrode and the drain electrode is spaced apart from the gate electrode in a plan view. The gate electrode includes a side surface inclined with respect to the surface of the insulating substrate and is partially overlapped with a portion of the source electrode or the drain electrode in a direction perpendicular to the side surface of the gate electrode.

14 Claims, 18 Drawing Sheets

THIN FILM TRANSISTOR SUBSTRATE, LIQUID CRYSTAL DISPLAY HAVING SAME, AND METHOD OF MANUFACTURING THE SAME

CROSS-REFERENCE TO RELATED APPLICATION

This application claims priority from and the benefit of Korean Patent Application No. 10-2011-0073671, filed on Jul. 25, 2011, which is hereby incorporated by reference for all purposes as if fully set forth herein.

BACKGROUND

1. Field

Exemplary embodiments of the present invention relate to a thin film transistor substrate, a liquid crystal display having the thin film transistor substrate, and a method of manufacturing the thin film transistor substrate.

2. Discussion of the Background

In general, a liquid crystal display includes two substrates and a liquid crystal layer disposed between the two substrates. The liquid crystal display applies an electric field to the liquid crystal layer to realign liquid crystal molecules in the liquid crystal layer, thereby controlling the amount of light passing through the liquid crystal layer.

At least one of the two substrates includes a plurality of pixels and a plurality of thin film transistors driving the pixels. In order to drive the pixels at a high speed, the display may include a thin film transistor that has a high ON-current ($I_{on}$ current) and is capable of charging the pixels to desired voltage level in a short period of time. To this end, if a width-to-length ratio of the channel of the thin film transistor is increased, the ON-current of the thin film transistor increases. However, the size of the thin film transistor increases if the width of the channel of the thin film transistor increases, thereby decreasing the aperture ratio of the pixel. Further, a parasitic capacitance between gate electrode and source electrode of the thin film transistor and/or a parasitic capacitance between gate electrode and drain electrode increases, and a kickback voltage increases when the size of the thin film transistor is reduced.

SUMMARY

Exemplary embodiments of the present invention provide a thin film transistor substrate having a reduced parasitic capacitance between gate electrode and drain electrode of a thin film transistor, a reduced kickback voltage, and an improved aperture ratio.

Exemplary embodiments of the present invention provide a display apparatus having an improved display quality.

Exemplary embodiments of the present invention provide a method of manufacturing the thin film transistor substrate. Additional features of the invention will be set forth in the description which follows, and in part will be apparent from the description, or may be learned by practice of the invention.

An exemplary embodiment of the present invention discloses a thin film transistor substrate including a substrate, a gate electrode disposed on a surface of the substrate, a gate insulating layer disposed on the gate electrode, a semiconductor layer disposed on the gate insulating layer, a first electrode disposed on the semiconductor layer, and a second electrode disposed on the semiconductor layer and spaced apart from the first electrode. The first electrode is spaced apart from the gate electrode when viewed in a direction perpendicular to the surface of the substrate, and the second electrode is partially overlapped with the gate electrode when viewed in the direction perpendicular to the surface of the substrate.

An exemplary embodiment of the present invention discloses a liquid crystal display including a first substrate, a second substrate, and a liquid crystal layer. The first substrate includes a pixel area, a first thin film transistor disposed in the pixel area, and a first pixel electrode connected to the first thin film transistor. The second substrate faces the first substrate and includes a common electrode. The liquid crystal layer is disposed between the first substrate and the second substrate. The first thin film transistor includes a first gate electrode disposed in the pixel area of the first substrate, a gate insulating layer disposed on the first gate electrode, a first semiconductor layer disposed on the gate insulating layer, a first source electrode disposed on the first semiconductor layer, a first drain electrode disposed on the first semiconductor layer and spaced apart from the first source electrode, and a first pixel electrode connected to the first drain electrode. One of the first source electrode and the first drain electrode is spaced apart from the first gate electrode when viewed in a plan view.

An exemplary embodiment of the present invention discloses a method of manufacturing a thin film transistor substrate, including performing a first process using a first mask to form a gate electrode on a substrate, forming a gate insulating layer on the gate electrode, and performing a second process using a second mask to form an active layer, an ohmic contact layer, a source electrode, and a drain electrode on the gate insulating layer. One of the source electrode and the drain electrode is spaced apart from the gate electrode when viewed in a plan view.

An exemplary embodiment of the present invention discloses a thin film transistor substrate including a gate electrode disposed in a first area of a substrate, a gate insulating layer enclosing the gate electrode, a semiconductor layer disposed on the gate insulating layer, a first electrode disposed on a first area of the semiconductor layer, and a second electrode disposed on a second area of the semiconductor layer and spaced apart from the first electrode. A channel between the first electrode and the second electrode is formed at a third area of the semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
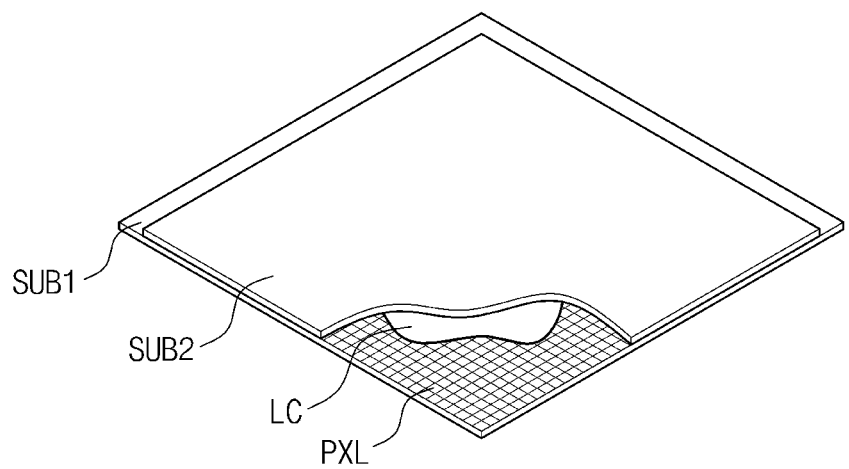
FIG. 1 is an exploded perspective view showing a display apparatus including a thin film transistor substrate according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
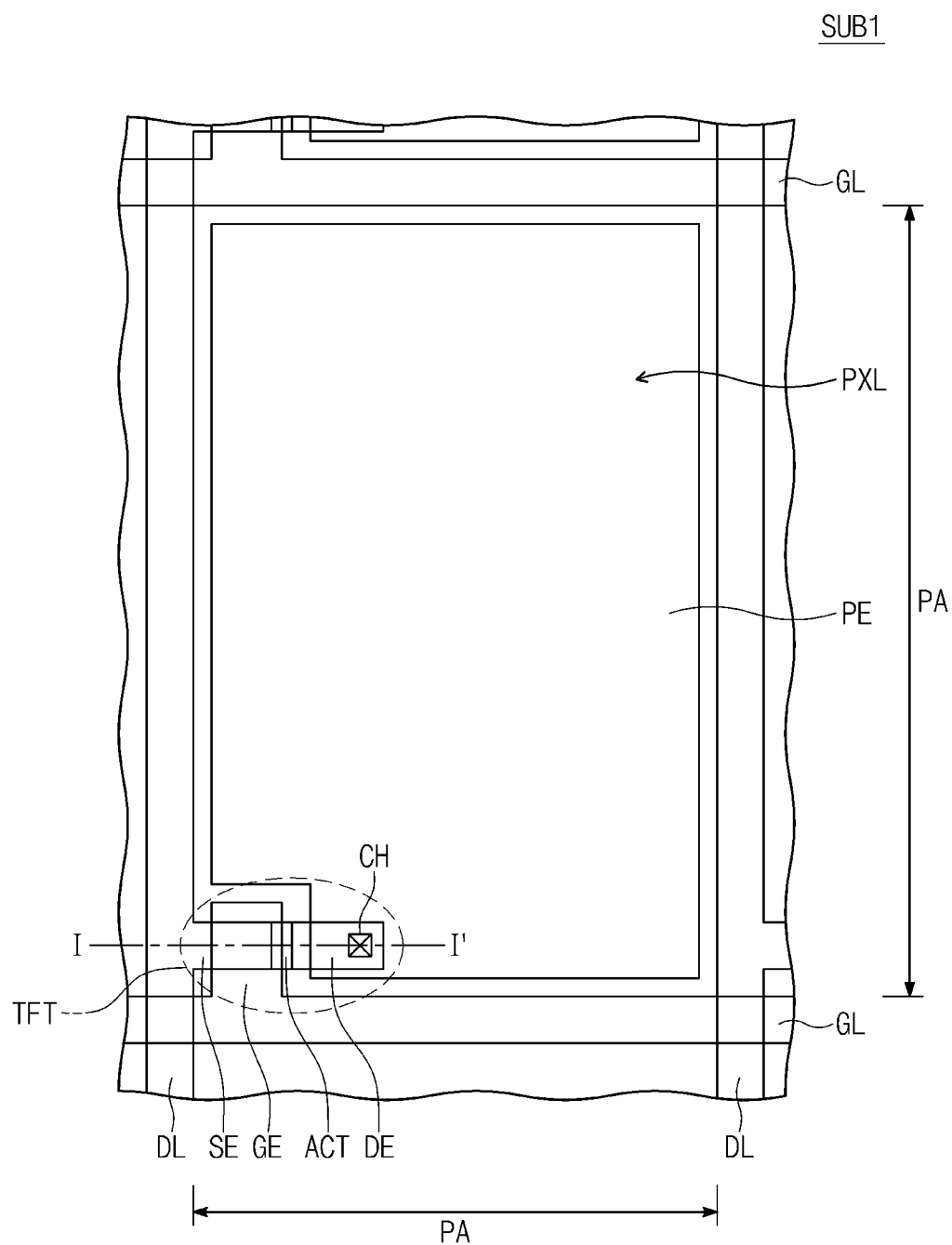
FIG. 2 is a plan view showing a part of the thin film transistor substrate according to the first exemplary embodiment of the present invention.
Figure 3:
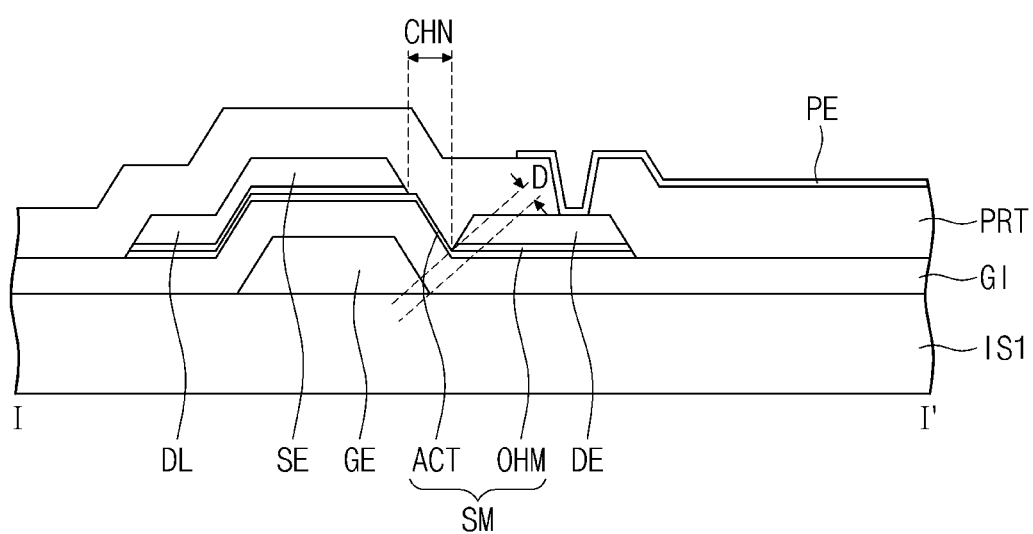
FIG. 3 is a cross-sectional view taken along the line I-I' shown in FIG. 2 according to the first exemplary embodiment of the present invention.

FIG. 1 is an exploded perspective view showing a display apparatus including a thin film transistor substrate according to a first exemplary embodiment of the present invention, FIG. 2 is a plan view showing a part of the thin film transistor substrate according to the first exemplary embodiment of the present invention, and FIG. 3 is a cross-sectional view taken along the line I-I' shown in FIG. 2 according to the first exemplary embodiment of the present invention.

Referring to FIG. 1, FIG. 2, and FIG. 3, a display apparatus includes a first substrate SUB1 having a plurality of pixels PXL, a second substrate SUB2 facing the first substrate SUB 1, and a liquid crystal layer LC disposed between the first substrate SUB1 and the second substrate SUB2.

The first substrate SUB1 may be a thin film transistor substrate on which thin film transistors are formed to drive liquid crystal molecules in the liquid crystal layer LC, and the second substrate SUB2 may be a color filter substrate on which color filters are formed to display colors for images.

The liquid crystal layer LC includes the liquid crystal molecules having an anisotropic dielectric constant. If an electric field is formed between the first substrate SUB1 and the second substrate SUB2, the liquid crystal molecules of the liquid crystal layer LC are rotated in a specific direction, thereby blocking or transmitting the light incident to the liquid crystal layer LC.

Referring to FIG. 2 and FIG. 3, the first substrate SUB1 includes a first insulating substrate IS1 having a plurality of pixel areas PA, a plurality of gate lines GL, a plurality of data lines DL, and a plurality of pixels PXL. In the present exemplary embodiment, the pixels PXL have the same structure and functions except the colors of the pixels, and thus one pixel PXL has been shown in FIG. 2 and FIG. 3 with the gate lines GL and the data lines DL, which are adjacent to the one pixel PXL.

The first insulating substrate IS1 is formed of a transparent insulating material. The pixel areas PA are arranged on the first insulating substrate IS1 in a matrix form.

The gate lines GL are disposed on the first insulating substrate IS1 and extended in a first direction. The data lines DL are extended in a second direction crossing the first direction. The second direction may be substantially perpendicular to the first direction. The data lines DL are disposed on the first insulating substrate IS1 while interposing a gate insulating layer GI between the gate lines GL and the data lines DL.

The pixels PXL are disposed corresponding to the pixel area PA, respectively. Each pixel PXL is connected to a corresponding gate line of the gate lines GL and a corresponding data line of the data lines DL. The pixel areas PA may be defined in various ways, for example, the pixel areas PA may be defined by the gate lines GL and the data lines DL on the first insulating substrate IS1.

Each pixel PXL includes a thin film transistor TFT and a pixel electrode PE connected to the thin film transistor TFT. The thin film transistor TFT includes a gate electrode GE, a semiconductor layer SM, a source electrode SE, and a drain electrode DE.

The gate electrode GE is protruded from the gate line GL (the corresponding gate line). The gate electrode GE includes an upper surface substantially parallel to an upper surface (hereinafter, referred to as a substrate surface) of the first insulating substrate IS1 and a side surface inclined with respect to the substrate surface. That is, the side surface of the gate electrode GE is inclined with respect to the substrate surface by a predetermined angle.

The semiconductor layer SM is disposed on the gate electrode GE while interposing the gate insulating layer GI therebetween. The gate insulating layer GI is disposed over the first insulating substrate IS1 to cover the gate line GL and the gate electrode GE. The gate insulating layer GI has a thickness in areas respectively corresponding to the upper surface and the side surface of the gate electrode GE. The gate insulating layer GI may be laminated on the upper surface and the side surface of the gate electrode GE and have a uniform thickness. Accordingly, the gate insulating layer GI includes an upper surface substantially parallel to the substrate surface and a side surface inclined with respect to the substrate surface.

The semiconductor layer SM includes an active layer ACT disposed on the gate insulating layer GI and an ohmic contact layer OHM disposed on the active layer ACT. The active layer ACT is disposed in areas each corresponding to the source electrode SE, the drain electrode DE, and an area between the source electrode SE and the drain electrode DE, respectively. The area of the active layer ACT corresponding to the area between the source electrode SE and the drain electrode DE may include a side surface inclined with respect to the substrate surface. The ohmic contact area of the ohmic contact layer OHM is disposed between the active layer ACT and the source electrode SE and between the active layer ACT and the drain electrode DE. Since the active layer ACT is formed on the gate insulating layer GI to have a predetermined thickness, the active layer ACT includes an upper surface substantially parallel to the substrate surface and a side surface inclined with respect to the substrate surface. The ohmic contact area OHM includes a first ohmic contact area disposed between the active layer ACT and the source electrode SE and a second ohmic contact area disposed between the active layer ACT and the drain electrode DE.

The source electrode SE and the drain electrode DE are disposed on the gate insulating layer GI while interposing the semiconductor layer SM therebetween. The source electrode SE is branched from the data line DL (the corresponding data line) and spaced apart from the drain electrode DE. In the present exemplary embodiment, one of the source electrode SE and the drain electrode DE is partially overlapped with the gate electrode GE when viewed in a direction perpendicular to the substrate surface (plan view direction), and the other of the source electrode SE and the drain electrode DE is spaced apart from the gate electrode GE when viewed in the direction perpendicular to the substrate surface. In exemplary embodiments of the present invention, the structure that the drain electrode DE is spaced apart from the gate electrode GE in the direction perpendicular to the substrate surface will be described as a representative example.

In the source electrode SE, an end portion of the source electrode SE, which is adjacent to the drain electrode DE, is disposed on the upper surface of the active layer ACT.

The drain electrode DE is spaced apart from the source electrode SE and the gate electrode GE when viewed in the direction perpendicular to the substrate surface. The drain electrode DE is disposed on the active layer ACT to be adjacent to the side surface of the active layer ACT, and thus the drain electrode DE is spaced apart from the source electrode SE while interposing the side surface of the active layer ACT therebetween. The drain electrode DE is not overlapped with the gate electrode GE when viewed in the direction perpendicular to the substrate surface, but the drain electrode DE may be partially overlapped with the gate electrode GE when viewed in a predetermined direction inclined with respect to the substrate surface. The predetermined direction inclined with respect to the substrate surface may be a direction perpendicular to the side surface of the gate electrode GE. In the present exemplary embodiment, the width D of the overlapped area in which the gate electrode GE is partially overlapped with the drain electrode DE is less than or equal to 1 micrometer. The width D may be the width of the overlapped area in which the side surface of the gate electrode GE, the ohmic contact layer and the drain electrode DE are overlapped when viewed in a direction perpendicular to the side surface of the gate electrode GE.

The pixel electrode PE is connected to the drain electrode DE directly through a contact hole CH of a protective layer PRT. The protective layer PRT is interposed between the pixel electrode PE and the drain electrode DE. The protective layer PRT includes the contact hole CH formed to expose a portion of the drain electrode DE therethrough, and the pixel electrode PE makes contact with the portion of the drain electrode DE through the contact hole CH.

The second substrate SUB2 includes a second insulating substrate (not shown) facing the first insulating substrate IS1 and a common electrode (not shown) disposed on the second insulating substrate. The common electrode (not shown) applies the electric field to the liquid crystal molecules in the liquid crystal layer LC in conjunction with the pixel electrode PE to drive the liquid crystal molecules in the liquid crystal layer LC.

In the display apparatus having the above-mentioned structure, when a driving signal is applied to the gate electrode GE through the gate line GL and an image signal is applied to the source electrode SE through the data line DL, a conductive channel CHN (hereinafter, referred to as a channel) is formed at a portion of the active layer ACT between the source electrode SE and the drain electrode DE, that is the side surface of the active layer ACT. A length of the side surface of the active layer ACT may be adjusted according to the shape of the side surface of the gate electrode GE. In other words, the length of the channel CHN may be adjusted by adjusting the thickness of the gate electrode GE. The length of the channel CHN may be shorter than the length of a channel of a conventional thin film transistor.

In the present exemplary embodiment, since the gate electrode GE and the drain electrode DE are overlapped with each other when viewed in the direction perpendicular to the side surface of the gate electrode GE, a current path is formed in the area of the active layer ACT, which corresponds to the overlapped area of the gate electrode GE and the drain electrode DE. Thus, the thin film transistor TFT is turned on and the image signal is applied to the pixel electrode PE, so that the electric field is formed between the pixel electrode PE and the common electrode to which a common voltage is applied. As a result, the liquid crystal molecules in the liquid crystal layer LC are driven by the electric field, thereby displaying an image corresponding to the amount of the light passing through the liquid crystal layer LC.

Figure 4A:
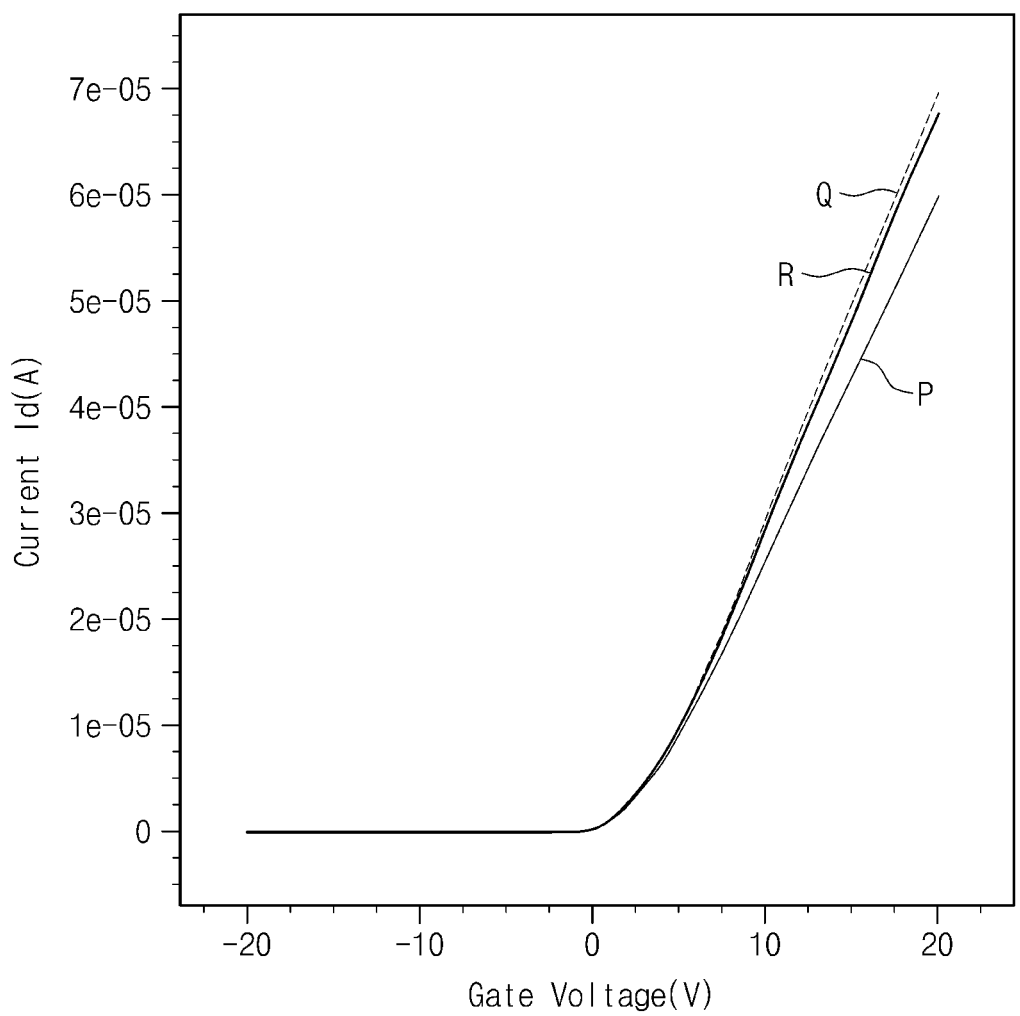
FIG. 4A and FIG. 4B show graphs of drain current (Id) versus gate voltage (Vg) according to the first exemplary embodiment of the present invention.
Figure 4B:
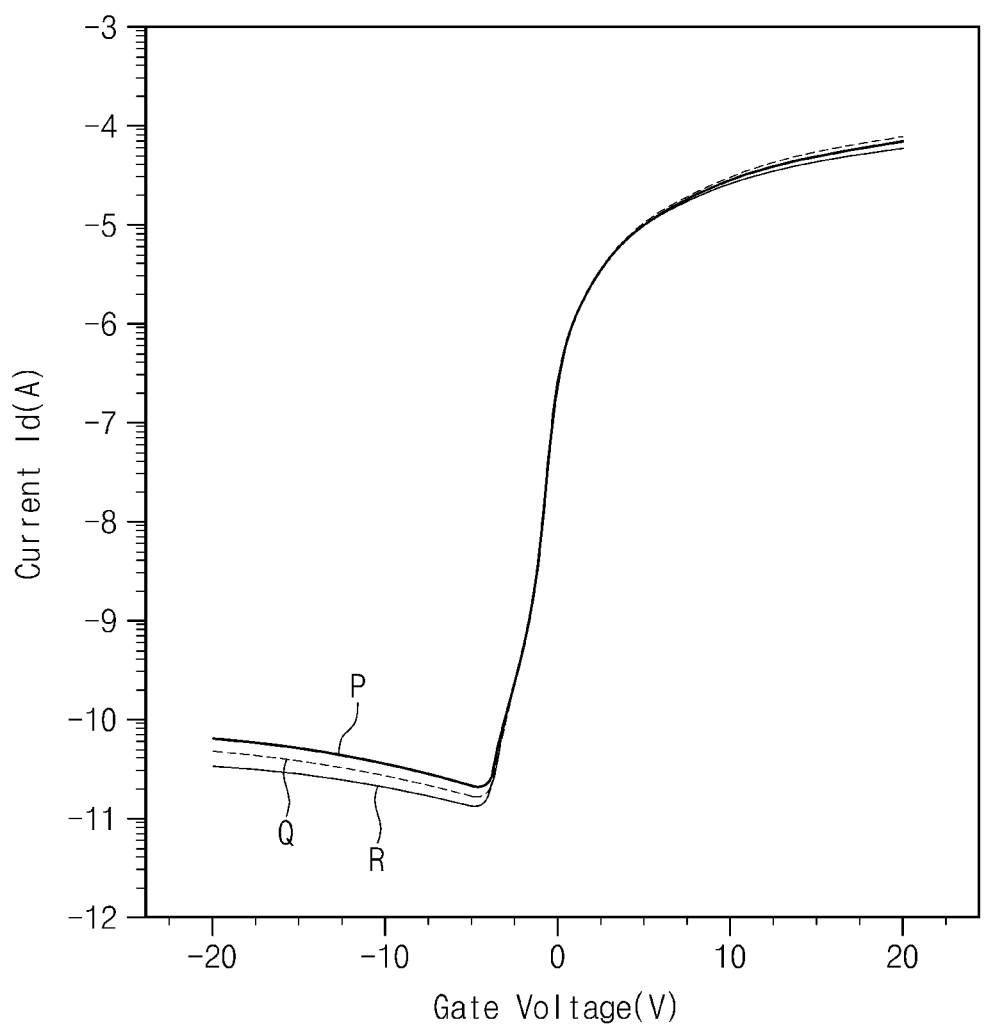

FIG. 4A and FIG. 4B show graphs of drain current (Id) versus gate voltage (Vg) of the thin film transistor in the thin film transistor substrate according to the first exemplary embodiment of the present invention. FIG. 4A shows a change in drain current (Id) versus the gate voltage (Vg) presented in a linear scale graph and FIG. 4B shows a change in drain current (Id) versus the gate voltage (Vg) presented in a log scale graph. In FIG. 4A and FIG. 4B, the thin film transistors include a gate electrode having thicknesses of about 3000 angstroms, a gate electrode having thickness of about 5000 angstroms, and a gate electrode having thickness of about 7000 angstroms, respectively. The Id-Vg curves in the gate electrodes, which respectively correspond to the thicknesses of about 3000 angstroms, about 5000 angstroms, and about 7000 angstroms, have been shown in P, Q, and R graphs respectively in FIG. 4A and FIG. 4B. In this case, the voltage applied to the gate electrodes has a voltage range of about −20 volts to about 20 volts, the gate insulating layer GI has a thickness of about 4500 angstroms, the active layer ACT has a thickness of about 1800 angstroms, and the ohmic contact layer OHM has a thickness of about 300 angstroms.

If the gate electrode GE has the thickness of about 7000 angstroms, the overlapped width of the gate electrode GE and the drain electrode DE is about 0.9 micrometers when the thin film transistor TFT is viewed in the direction perpendicular to the side surface of the gate electrode GE. The overlapped width of the gate electrode GE and the data electrode DE is about 0.1 micrometers when the thin film transistor TFT is viewed in the direction perpendicular to the side surface of the gate electrode GE if the gate electrode GE has the thickness of about 3000 angstroms.

Referring to FIG. 4A and FIG. 4B, when the gate electrode GE has the thickness of about 3000 angstroms, about 5000 angstroms, or about 7000 angstroms, the thin film transistors are operated normal. The table below shows the maximum value of the ON-current (Ion) according to the thickness of the gate electrode GE.

TABLE

| | Thickness of gate electrode (Å) | | |
|---|---|---|---|
| | 3000 | 5000 | 7000 |
| Maximum value of ON-current (Ion) | 59.8 | 69.5 | 67.6 |

As shown in the above Table, when the gate electrode GE has the thickness of about 3000 angstroms, the ON-current Ion is reduced by about 12% in comparison with the ON-current Ion obtained when the gate electrode GE has the thickness of about 7000 angstroms. Thus, even though the gate electrode GE is formed to have the thickness of about 3000 angstroms, the thin film transistor may have the capability to drive the liquid crystal layer LC.

Further, in the thin film transistor substrate according to the first exemplary embodiment, as the width and the area of the overlapped area of the gate electrode GE and the drain electrode DE are reduced, the parasitic capacitance between the gate electrode GE and the drain electrode DE and the kickback voltage may be reduced while increasing the ON-current. Further, the size of the thin film transistor does not need to be increased to increase the width-to-length ratio (W/L) of the channel of the thin film transistor. The width-to-length ratio may be reduced by reducing the length of the channel by forming the structure of the thin film transistor TFT according to exemplary embodiments of the present invention. As a result, the size of the thin film transistor TFT may be reduced and the parasitic capacitance and the kickback voltage may also be reduced, thereby improving display quality of the display apparatus.

In the first exemplary embodiment, the thin film transistor substrate is applied to the display apparatus, but it should not be limited thereto or thereby. For instance, the thin film transistor substrate according to the first exemplary embodiment may be applied to various apparatuses after removing the protective layer PRT or the pixel electrode PE. In addition, the thin film transistor substrate is employed to the liquid crystal display as an example; however it should not be limited to the liquid crystal display. For example, the thin film transistor substrate according to the first exemplary embodiment may be applied to various active matrix display apparatuses, such as an organic light emitting display apparatus, an inorganic light emitting display apparatus, an electrophoretic display apparatus, an electro-wetting display apparatus, a plasma display panel, or a microelectromechanical system display, etc.

The thin film transistor substrate according to the first exemplary embodiment may be manufactured by a photolithography process using a first mask and a fourth mask.

FIG. 5A, FIG. 6A, FIG. 7A, and FIG. 8A are plan views showing manufacturing process of the thin film transistor substrate shown in FIG. 2 and FIG. 3 according to an exemplary embodiment of the present invention, and FIG. 5B, FIGS. 6B-6E, FIG. 7B, and FIG. 8B are cross-sectional views respectively taken along lines II-IF shown in FIG. 5A, FIG. 6A, FIG. 7A, and FIG. 8A.

Figure 5A:
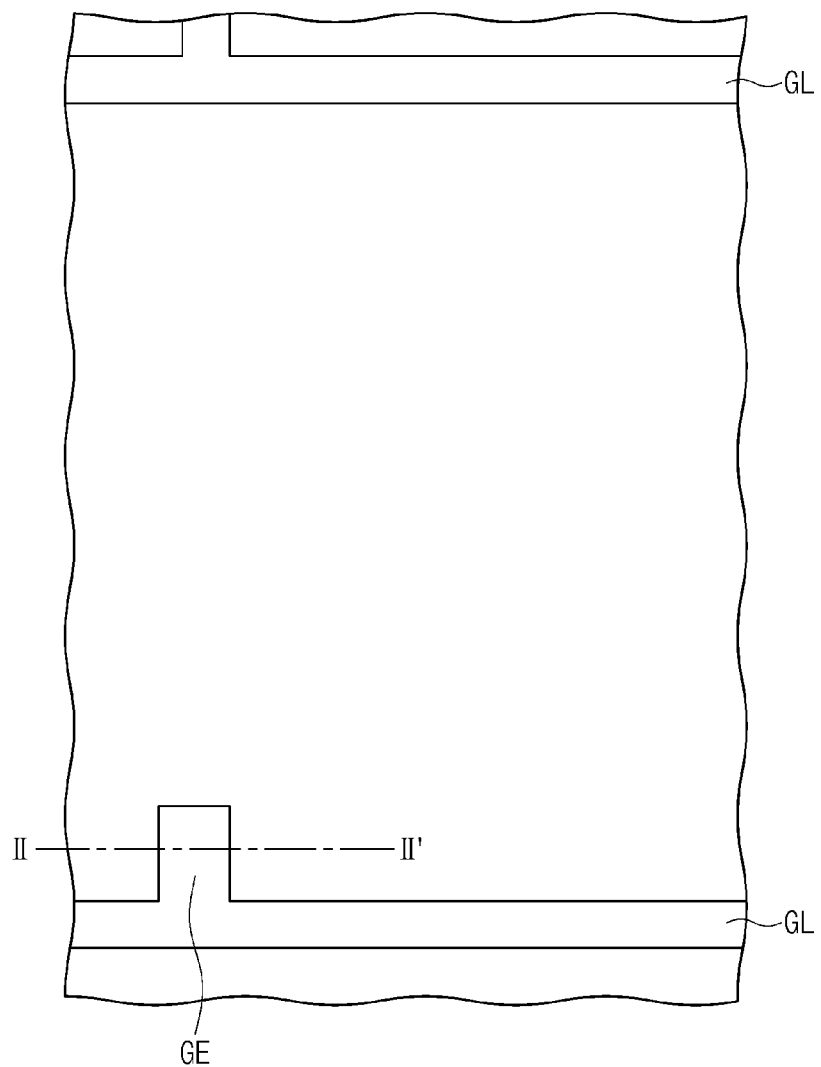
FIG. 5A, FIG. 6A, FIG. 7A, and FIG. 8A are plan views showing manufacturing process of the thin film transistor substrate shown in FIG. 2 and FIG. 3.
Figure 5B:
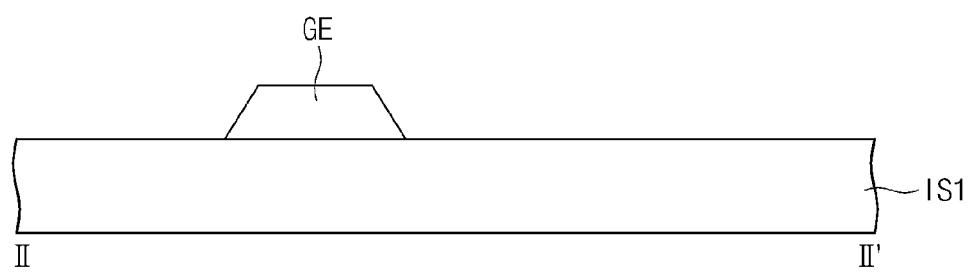
FIG. 5B, FIGS. 6B-6E, FIG. 7B, and FIG. 8B are cross-sectional views respectively taken along lines II-IF shown in FIG. 5A, FIG. 6A, FIG. 7A, and FIG. 8A.

As shown in FIG. 5A and FIG. 5B, a gate line pattern is formed on the first insulating substrate IS1 using a first conductive material. The first insulating substrate IS1 is formed of a transparent insulating material. The gate line pattern includes the gate electrode GE and the gate line GL. The gate line pattern is formed by depositing the first conductive material over the first insulating substrate IS1 to form a first conductive layer (not shown) and performing a photolithography process (a first process) using a first mask (not shown) on the first conductive layer.

In the present exemplary embodiment, the first conductive material may include a metal material, such as copper (Cu), molybdenum (Mo), aluminum (Al), tungsten (W), chromium (Cr), and the first conductive layer may have a single-layer structure, a multi-layer structure, or an alloy layer structure using the first conductive material. For instance, the first conductive layer may have a triple-layer structure of molybdenum-aluminum-molybdenum (Mo—Al—Mo) or an alloy layer of molybdenum-aluminum (Mo—Al).

Then, the semiconductor pattern SM, the source electrode SE, and the drain electrode DE may be substantially simultaneously formed by a photolithography process (a second process) using a diffractive exposure. Hereinafter, the second process will be described in more detail with reference to FIG. 6B, FIG. 6C, FIG. 6D, and FIG. 6E.

Figure 6A:
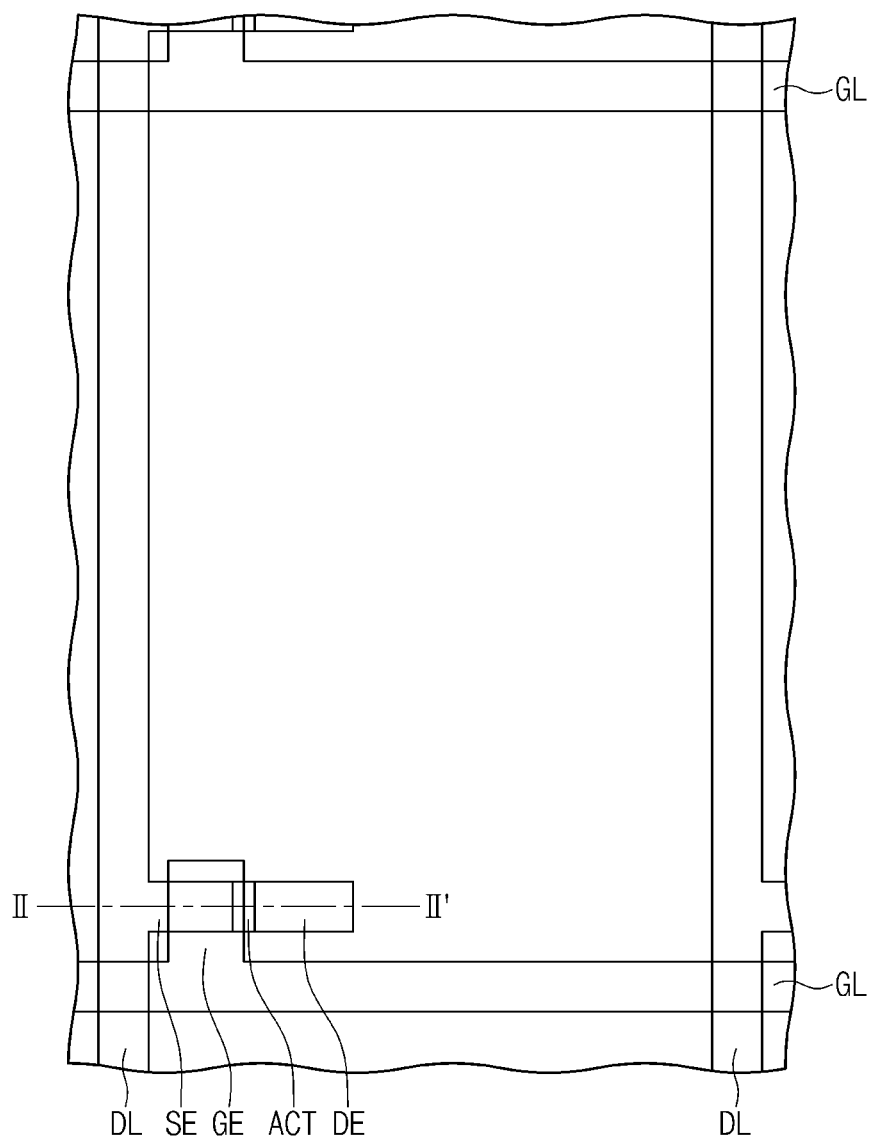
Figure 6B:
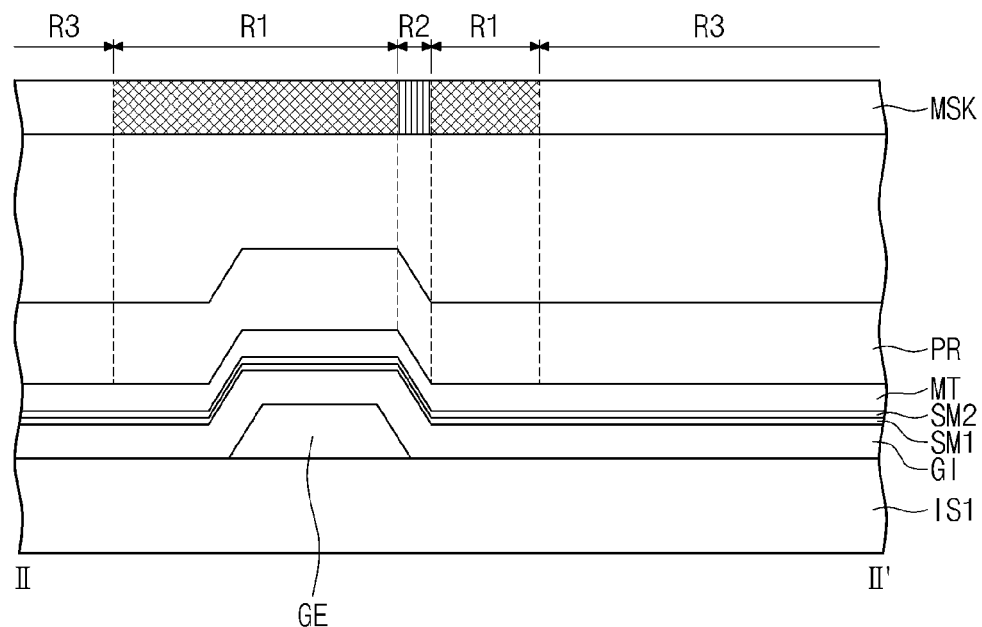

Referring to FIG. 6B, the gate insulating layer GI, an amorphous silicon layer SM1, an n+ amorphous silicon layer SM2, and a second conductor layer MT are sequentially deposited over the first insulating substrate IS1 on which the gate electrode GE and the gate line GL are previously formed.

The second conductive layer MT is formed of a second conductive material, and the second conductive material includes a metal material, such as copper, molybdenum, aluminum, tungsten, chromium, etc. In addition, the second conductive layer MT has a single-layer structure, a multi-layer structure, or an alloy layer structure using the second conductive material.

Then, a first photoresist layer PR is formed over the first insulating substrate IS1 using a photoresist material and light is irradiated onto the first photoresist layer PR through a second mask MSK.

The second mask MSK is a slit mask including a first region R1 that blocks the light incident thereto, a second region R2 that blocks a portion of the light incident thereto and transmits a remaining portion of the light incident thereto using a slit pattern applied therein, and a third region R3 transmits the light incident thereto, so that only the light transmitted through the second mask MSK is irradiated onto the first photoresist layer PR. In the present exemplary embodiment, the upper surface of the first insulating substrate IS1 is positioned below the first region R1, the second region R2, and the third region R3 and divided into multiple areas respectively corresponding to the first, second, and third regions R1, R2, and R3. Thus, the multiple areas of the first substrate SUB1 will be referred to as a first region R1, a second region R2, and a third region R3.

Next, if the first photoresist layer PR exposed to the light through the second mask MSK is developed, a first photoresist layer pattern PR1 having a first thickness and a second photoresist layer pattern PR2 having a second thickness respectively remain in the first area R1 in which the light is entirely blocked and the second area R2 in which the light is partially blocked, and the first photoresist layer PR is completely removed in the third area R3 to expose the surface of the second conductive layer MT.

In this case, since the irradiation amount of the light in the slit region, e.g., the second region R2, is larger than the irradiation amount of the light in the blocking region, e.g., the first region R1, the second photoresist layer pattern PR2 has a thickness thinner than the thickness of the first photoresist layer pattern PR1.

In the present exemplary embodiment, a positive photoresist layer is used to remove the first photoresist layer PR that is exposed to the light, but it should not be limited to the positive photoresist layer. That is, a negative photoresist layer may be used to remove the first photoresist layer PR by blocking the light. That is, a photoresist layer PR that is not exposed to light may be removed if the negative photoresist layer is used.

Figure 6C:
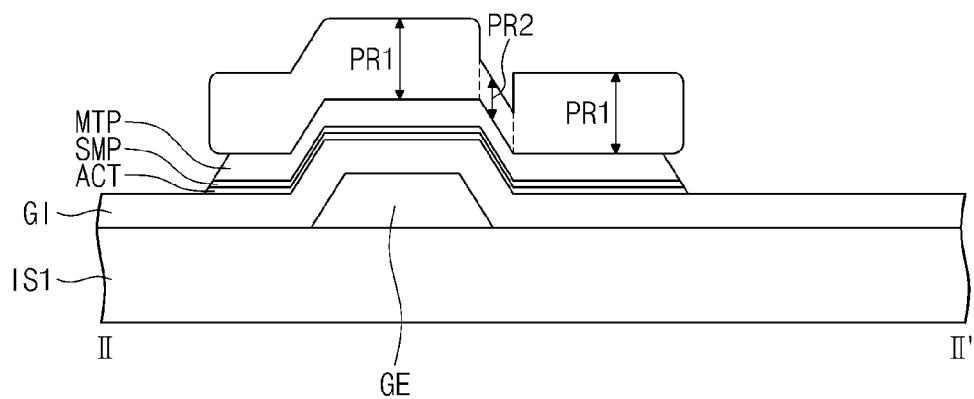

Then, as shown in FIG. 6C, a portion of the amorphous silicon layer SM1, a portion of the n+ amorphous silicon layer SM2, and a portion of the second conductive layer MT are selectively removed using the first photoresist layer pattern PR1 and the second photoresist layer pattern PR2 as a mask. Accordingly, the active layer ACT of the amorphous silicon layer is formed in a predetermined area on the gate electrode GE, an n+ amorphous silicon layer pattern SMP is formed on the active layer ACT, and a second conductive layer pattern MTP of the second conductive material is formed on the n+ amorphous silicon layer pattern SMP.

Figure 6D:
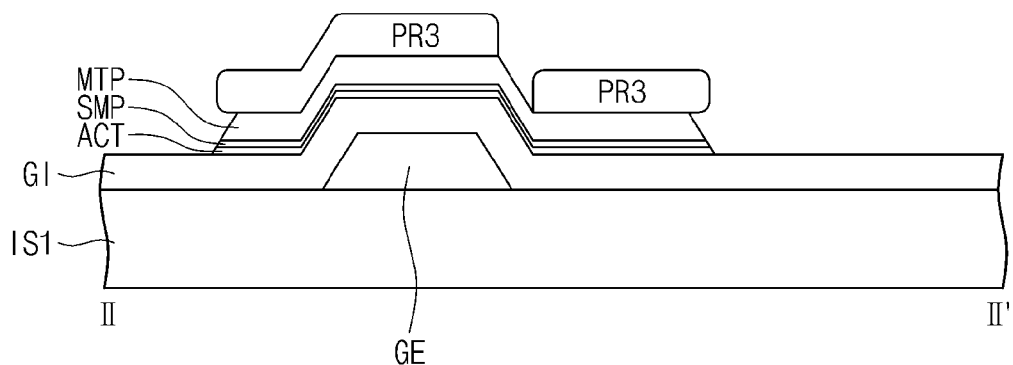

If a portion of the first photoresist layer pattern PR1 is partially removed and the second photoresist layer pattern PR2 is removed by an ashing process or an etch back process, as shown in FIG. 6D, the second photoresist layer pattern PR2 is completely removed in the second region R2 to which the diffractive exposure is applied, and thus the surface of the second conductive layer pattern MTP is partially exposed.

Further, the first photoresist layer pattern PR1 is partially removed by the thickness of the second photoresist layer pattern PR2, thereby forming a third photoresist layer pattern PR3. As a result, the third photoresist layer pattern PR3 remains only in the third region R3, as shown in FIG. 6D.

Figure 6E:
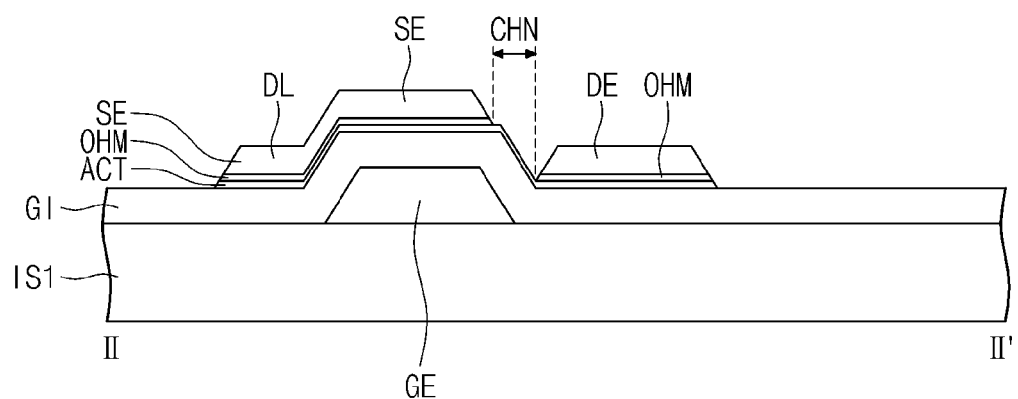

Then, as shown in FIG. 6E, a portion of the second conductive layer pattern MTP and a portion of the n+ amorphous silicon layer pattern SMP, which are disposed above the active layer ACT, are removed using the third photoresist layer pattern PR3 as a mask, and then the third photoresist layer pattern PR3 is removed. As a result, one portion of the ohmic contact layer OHM of the n+ amorphous silicon layer covering the upper direction of the gate electrode GE is formed on the active layer ACT and the other portion of the ohmic contact layer OHM of the n+ amorphous silicon layer is formed on the active layer ACT, and the source electrode SE and the drain electrode DE which are electrically connected to each other through each of the two portions of the ohmic contact layer OHM are formed. Also, a channel CHN is formed between the source electrode SE and the drain electrode DE. The ohmic contact layer OHM, the source and drain electrodes SE and DE, and the channel CHN are substantially simultaneously formed. In addition, each of the two portions of the ohmic contact layer OHM is patterned to have the same shape as the source electrode SE and the drain electrode DE, respectively.

Figure 7A:
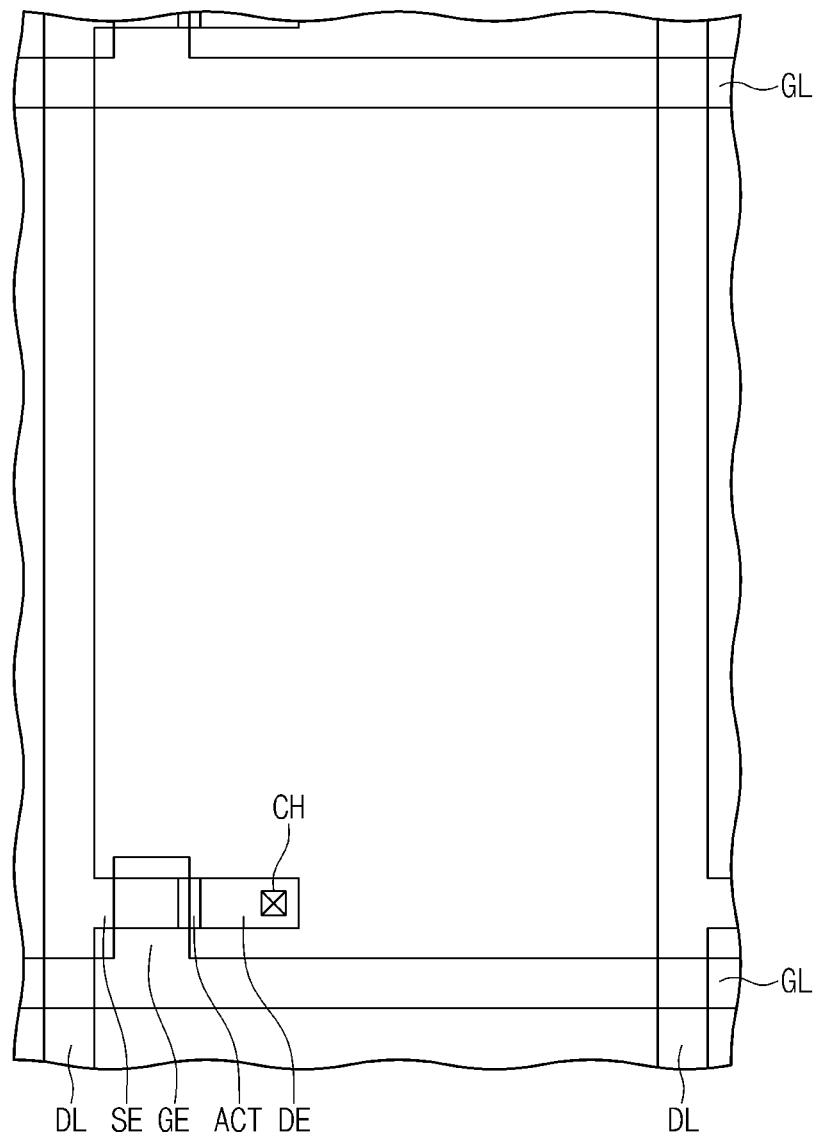
Figure 7B:
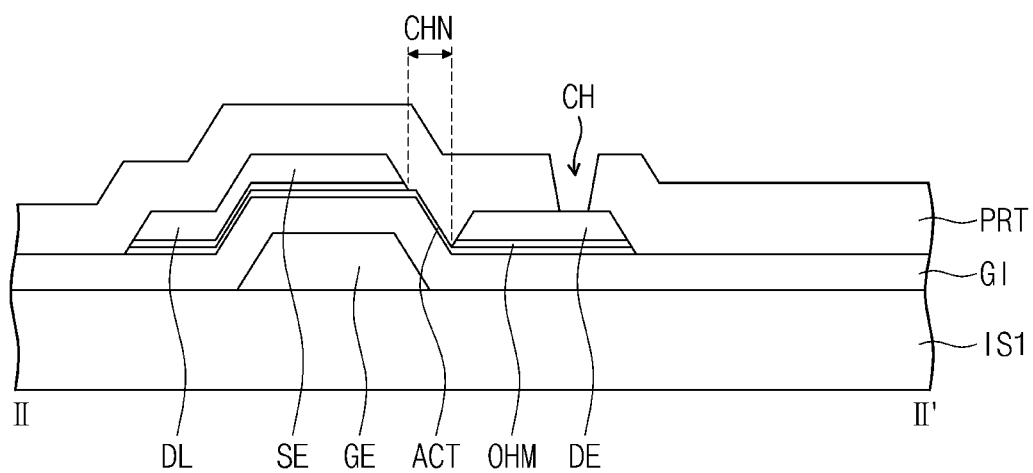

Then, as shown in FIG. 7A and FIG. 7B, the protective layer PRT is formed on the first insulating substrate IS1 using organic or inorganic insulating material. The protective layer PRT includes the contact hole CH through which the portion of the drain electrode DE is exposed. The protective layer PRT is formed by depositing the organic or inorganic material over the first insulating substrate IS1 and patterning the organic or inorganic material through a photolithography process (a third process) using a third mask (not shown).

Figure 8A:
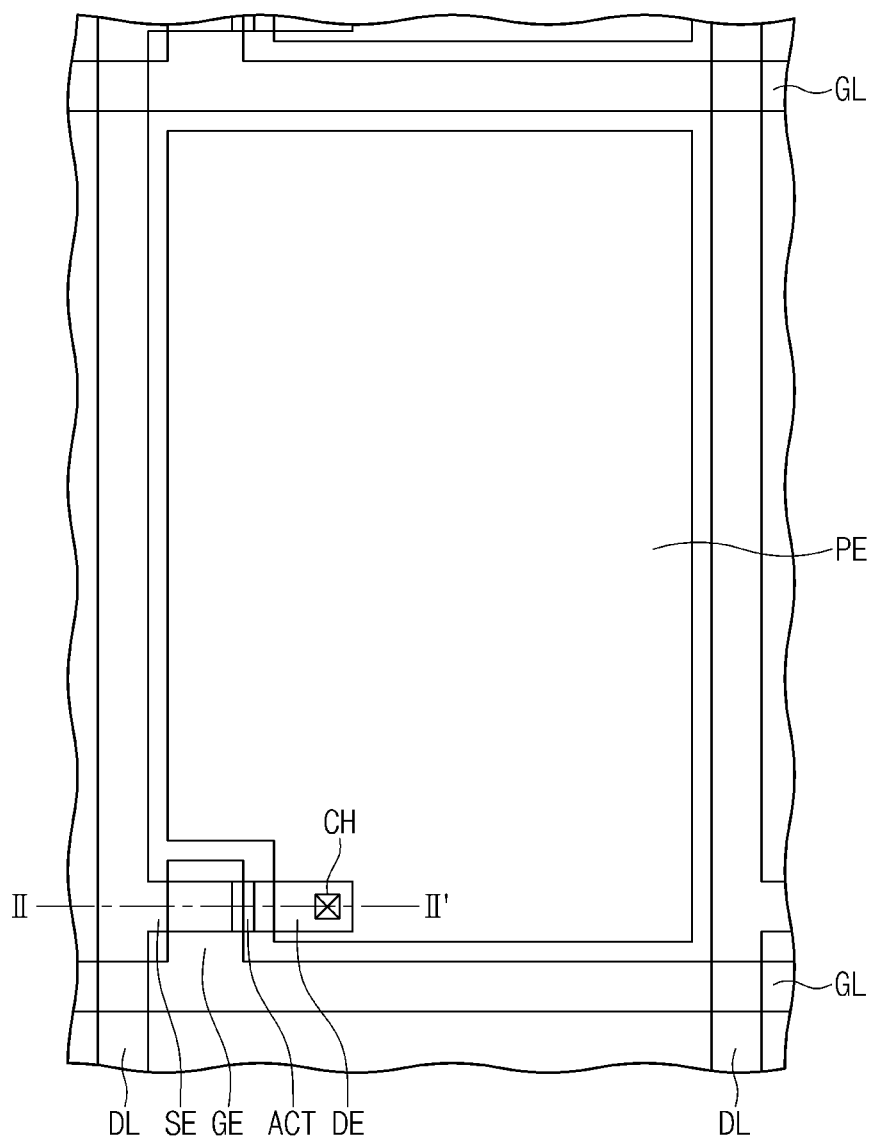
Figure 8B:
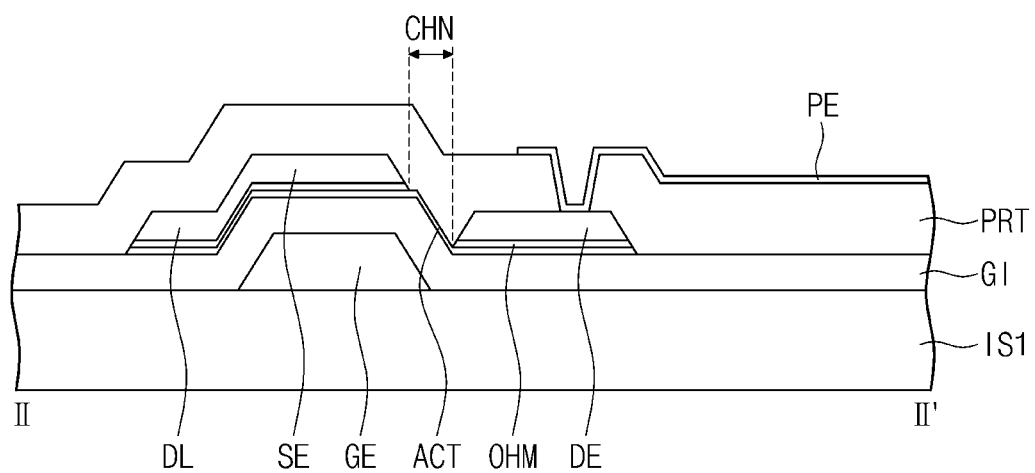

Referring to FIG. 8A and FIG. 8B, a third conductive layer is formed on the first insulating substrate IS1 using a transparent conductive material after forming the protective layer PRT, and then a photolithography process (a fourth process) is performed on the third conductive layer using a fourth mask (not shown) to form the pixel electrode PE.

The thin film transistor substrate according to the first exemplary embodiment may be manufactured by the first, second, third, and fourth processes. The thin film transistor substrate is coupled with the color filter substrate (not shown) to form the display apparatus, and the color filter substrate includes color filters formed thereon to display red, green, and blue colors.

Figure 9:
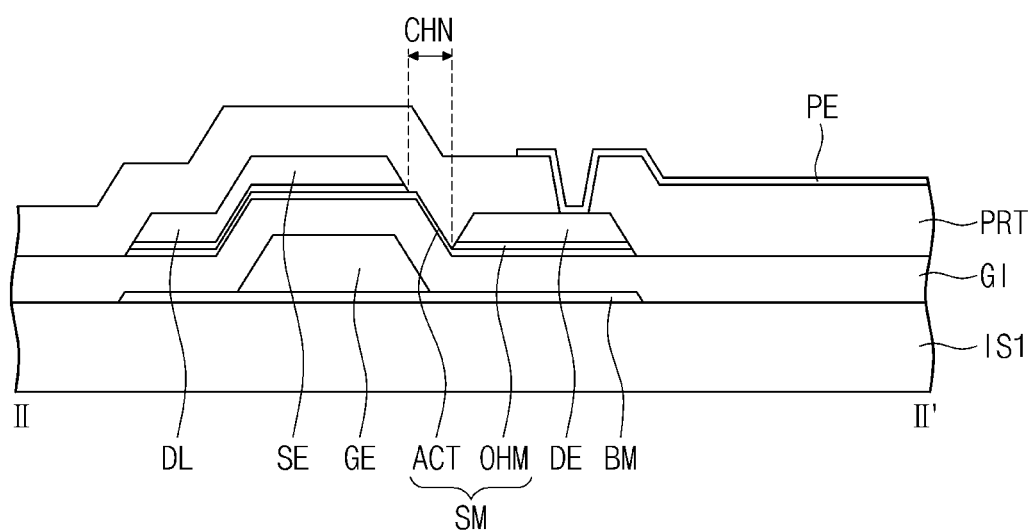
FIG. 9 is a cross-sectional view showing a thin film transistor substrate according to a second exemplary embodiment of the present invention.

FIG. 9 is a cross-sectional view showing a thin film transistor substrate according to a second exemplary embodiment of the present invention.

The thin film transistor substrate according to the second exemplary embodiment has almost the same structure and functions as those of the thin film transistor substrate according to the first exemplary embodiment except for some elements, and thus detailed descriptions of the same elements will be omitted and the same reference numerals will be assigned to the same elements.

Referring to FIG. 2, FIG. 3, and FIG. 9, the thin film transistor substrate according to the second exemplary embodiment includes a first insulating substrate IS1, a plurality of gate lines GL, a plurality of data lines DL, a plurality of pixels PXL, and a black matrix BM. Each pixel PXL includes a thin film transistor TFT and a pixel electrode PE connected to the thin film transistor TFT.

The black matrix BM is disposed between the first insulating substrate IS1 and the gate electrode GE to block a portion of light waves propagating to the upper portion of the first insulating substrate IS1 from the lower portion of the first insulating substrate IS1 among the light waves passing through the first substrate SUB1.

When viewed in the direction perpendicular to the substrate surface (a plan view), the black matrix BM covers the channel CHN of the thin film transistor TFT, which corresponds to the area between the source electrode SE and the drain electrode DE of the thin film transistor. In addition, the black matrix BM may cover not only the area in which the channel CHN is formed but also the area in which the active layer ACT is formed. The black matrix BM prevents a photo-current caused by an external light wave when the thin film transistor substrate is used as a part of the display apparatus.

Further, the black matrix BM may cover areas corresponding to the gate line GL, the data line DL, and the thin film transistor TFT when viewed in the direction perpendicular to the substrate surface (a plan view). In this case, a black matrix BM does not need to be formed on the color filter substrate.

Figure 10:
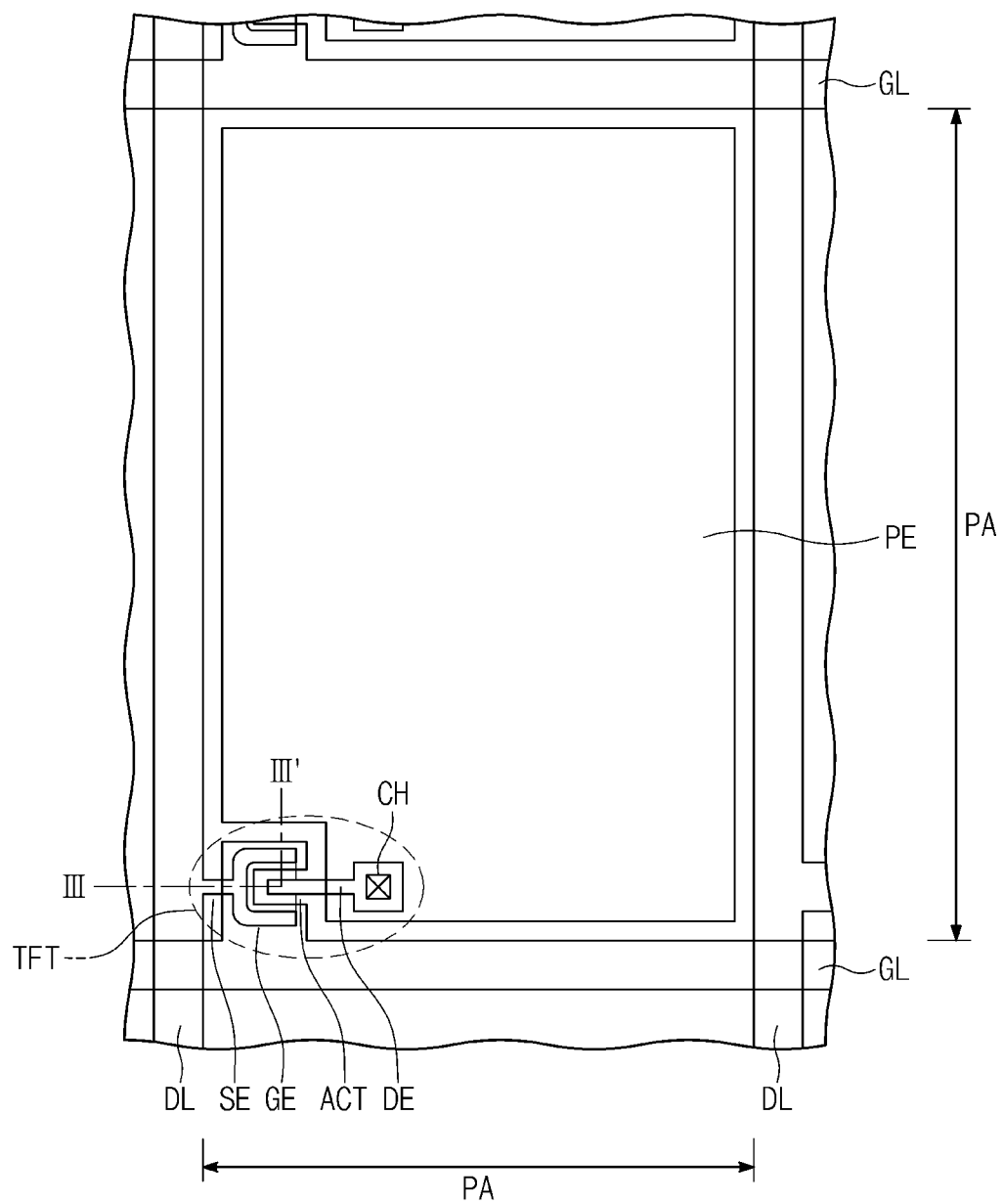
FIG. 10 is a plan view showing a thin film transistor substrate according to a third exemplary embodiment of the present invention.
Figure 11:
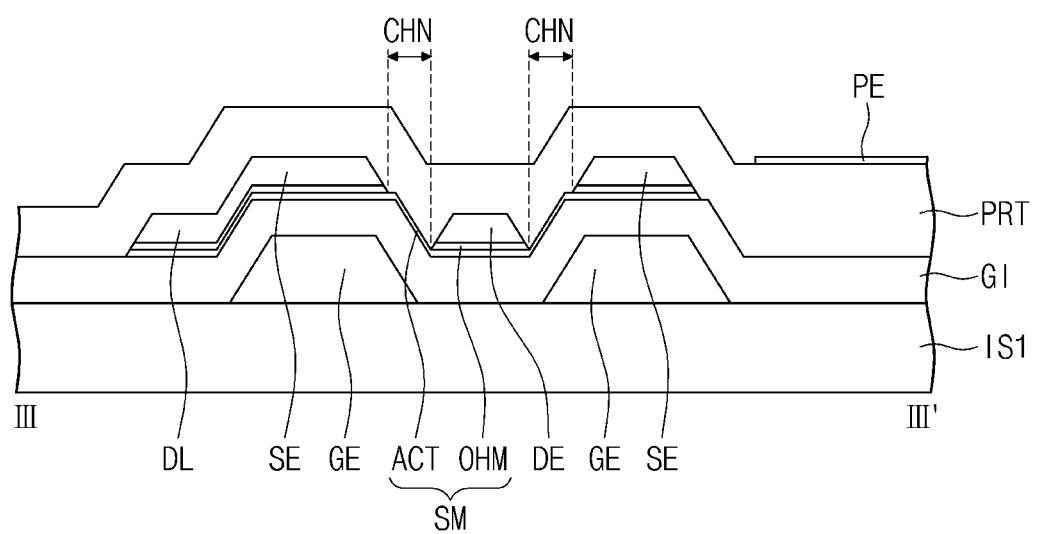
FIG. 11 is a cross-sectional view taken along the bent line III-III' shown in FIG. 10 according to the third exemplary embodiment of the present invention.

FIG. 10 is a plan view showing a thin film transistor substrate according to a third exemplary embodiment of the present invention, and FIG. 11 is a cross-sectional view taken along the bent line III-III' shown in FIG. 10 according to the third exemplary embodiment of the present invention. In FIG. 10 and FIG. 11, the same reference numerals denote the same elements in FIG. 1 and FIG. 2, and thus detailed descriptions of the same elements will be omitted.

Referring to FIG. 10 and FIG. 11, the thin film transistor substrate according to the third exemplary embodiment includes the first insulating substrate IS1, the gate lines GL, the data lines DL, and the pixels PXL.

Each pixel PXL includes the thin film transistor TFT and the pixel electrode PE connected to the thin film transistor TFT. The thin film transistor TFT includes the gate electrode GE, the semiconductor layer SM, the source electrode SE, and the drain electrode DE.

The gate electrode GE is protruded from the gate line GL. When viewed in a plan view shown in FIG. 10, the gate electrode GE has a concave portion obtained by removing a portion of the gate electrode GE in the protruded area. The gate electrode GE may have a U-shape to correspond to the shape of the concave portion when viewed in a plan view (the direction perpendicular to the substrate surface). The gate electrode GE includes the upper surface substantially parallel to the substrate surface of the first insulating substrate IS1 and the side surface inclined with respect to the substrate surface. The upper surface of the gate electrode GE may also have a U-shape when viewed in a plan view, and the side surface of the gate electrode GE may include multiple side surfaces (i.e., three inner side surfaces adjacent to the concave portion).

The semiconductor layer SM is disposed on the gate electrode GE while interposing the gate insulating layer GI therebetween. The gate insulating layer GI is disposed over the first insulating substrate IS1 to cover the gate line GL and the gate electrode GE. The gate insulating layer GI has the predetermined thickness on the upper surface and the side surface of the gate electrode GE. Accordingly, the gate insulating layer GI includes the upper surface substantially parallel to the substrate surface and the side surface inclined with respect to the substrate surface. The upper surface of the gate insulating layer GI may also have a U-shape when viewed in a plan view, and the side surface of the gate insulating layer GI may include multiple side surfaces (i.e., three inner side surfaces adjacent to the concave portion of the gate electrode GE).

The semiconductor layer SM includes the active layer ACT disposed on the gate insulating layer GI and the ohmic contact layer OHM disposed on the active layer ACT. One portion of the ohmic contact layer OHM connected to the source electrode SE includes a concave portion obtained by removing a portion thereof in an area corresponding to the concave portion of the gate electrode GE when viewed in a plan view. The other portion of the ohmic contact layer OHM connected to the drain electrode DE is located inside of the area corresponding to the concave portion of the gate electrode GE. That is, three side surfaces of the ohmic contact layer OHM corresponding to the concave portion of the gate electrode GE are removed (the removed three side surfaces of the ohmic contact layer form a U-shape when viewed in a plan view). In the present exemplary embodiment, since the active layer ACT has the predetermined thickness on the gate insulating layer GI, the active layer ACT includes the upper surface substantially parallel to the substrate surface and the side surface inclined with respect to the substrate surface. The upper surface of the active layer ACT may also have a U-shape when viewed in a plan view, and the side surface of the active layer ACT may include multiple side surfaces (i.e., three inner side surfaces adjacent to the concave portion of the gate electrode GE).

The source electrode SE is branched from the data line DL and at least a portion of the source electrode SE is overlapped with the upper surface of the gate electrode GE when viewed in a plan view. In addition, the source electrode SE includes a concave portion obtained by removing a portion thereof in an area corresponding to the concave portion of the gate electrode GE and the ohmic contact layer OHM. An end portion of the source electrode SE, which faces the drain electrode DE, is disposed on the upper surface of the active layer ACT while interposing a portion of the ohmic contact layer OHM. The end portion of the source electrode SE which faces the drain electrode DE may have a U-shape when viewed in a plan view.

The drain electrode DE is spaced apart from the source electrode SE and is spaced apart from the gate electrode GE when viewed in a plan view. The drain electrode DE is disposed adjacent to the side surface of the active layer ACT in the concave portion. The drain electrode DE is not overlapped with the gate electrode GE when viewed in a plan view, but the drain electrode DE is partially overlapped with the gate electrode GE when viewed in a direction perpendicular to the side surface of the gate electrode GE (the viewing direction perpendicular to the side surface of the gate electrode GE may include three different viewing directions and the three different viewing directions may be perpendicular to each of the three inner side surfaces of the gate electrode GE). In the present exemplary embodiment, the width of the overlapped area of the gate electrode GE and the drain electrode DE is less than or equal to about 1 micrometer when viewed in the direction perpendicular to the side surface of the gate electrode GE.

The pixel electrode PE is connected to the drain electrode DE while interposing the protective layer PRT therebetween. The protective layer PRT includes a contact hole CH to expose a portion of the drain electrode DE and the pixel electrode PE makes contact with the portion of the drain electrode DE directly through the contact hole CH.

In the thin film transistor substrate having the above-mentioned structure, the width of the channel of the thin film transistor may be increased by enclosing the drain electrode DE with the U-shaped source electrode SE and the length of the channel of the thin film transistor may be shortened.

Figure 12:
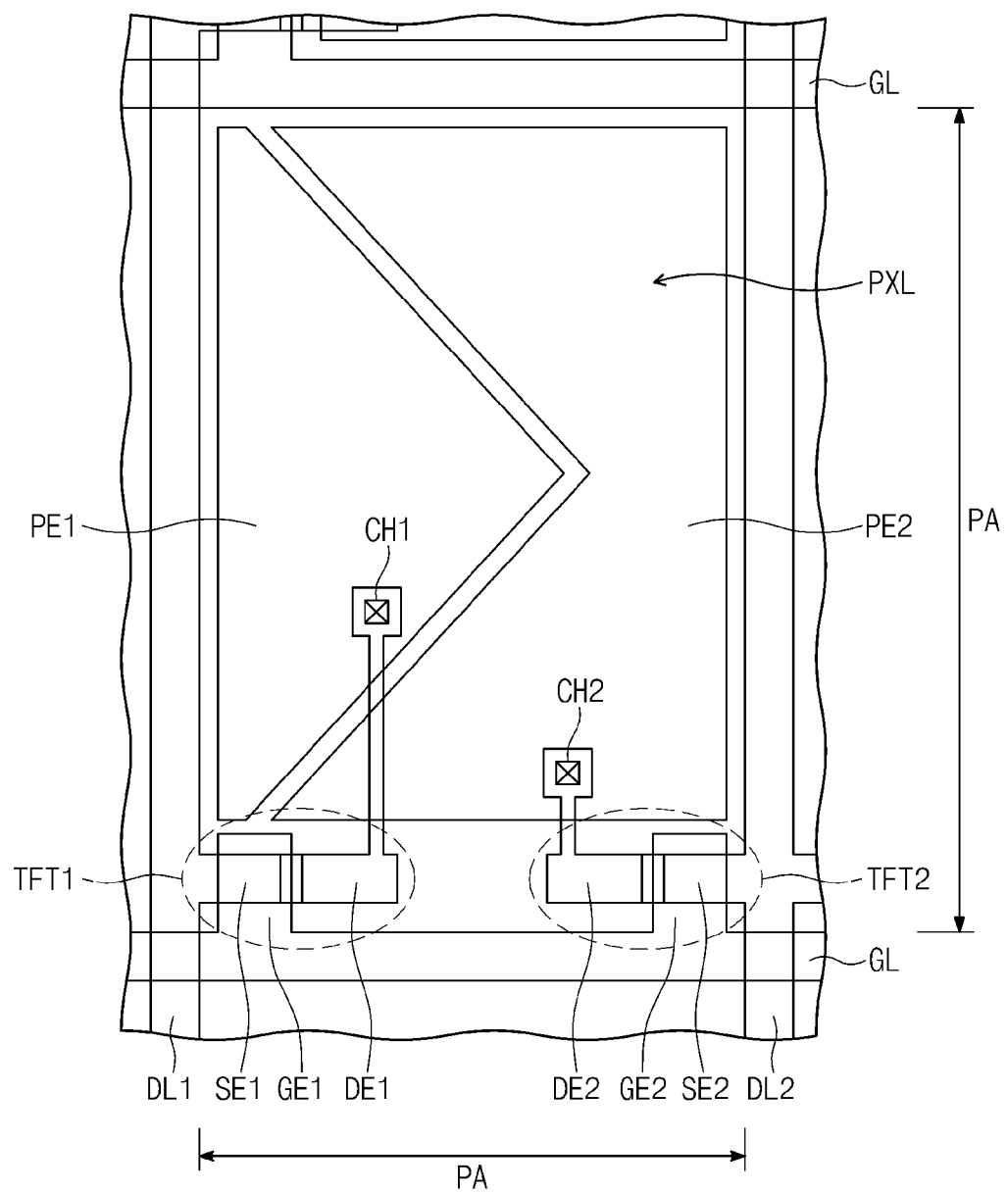
FIG. 12 is a plan view showing a thin film transistor substrate according to a fourth exemplary embodiment of the present invention.

FIG. 12 is a plan view showing a thin film transistor substrate according to a fourth exemplary embodiment of the present invention. FIG. 12 shows the thin film transistor substrate according to the fourth exemplary embodiment applied to a multi-domain liquid crystal display. In FIG. 12, the same reference numerals denote the same elements in FIG. 1 and FIG. 2, and thus detailed descriptions of the same elements will be omitted.

Referring to FIG. 2, FIG. 3, and FIG. 12, the thin film transistor substrate according to the fourth exemplary embodiment includes the first insulating substrate IS1, the gate lines GL, first data lines DL1, second data lines DL2, and the pixels PXL. The data lines DL include the first data lines DL1 and the second data lines DL2.

The first insulating substrate IS1 includes the pixel areas PA. Each pixel area PA includes a corresponding pixel of the pixels PXL and each pixel PXL is connected to a corresponding gate line among the gate lines GL, a corresponding first data line among the first data lines DL1, and a corresponding second data line among the second data lines DL2. In the present exemplary embodiment, the pixels PXL have substantially the same structure and functions, and thus one exemplary pixel has been shown in FIG. 12.

The gate lines GL are extended in a first direction on the first insulating substrate IS1. The first data lines DL1 are extended in a second direction crossing the first direction. The second direction is substantially perpendicular to the first direction. The second data lines DL2 are extended in the second direction and alternately arranged with the first data lines DL1. The first and second data lines DL1 and DL2 are disposed on the first insulating substrate and insulated from the gate lines GL while interposing the gate insulating layer therebetween.

Each pixel PXL includes a first thin film transistor TFT1, a second thin film transistor TFT2, a first pixel electrode PE1 connected to the first thin film transistor TFT1, and a second pixel electrode PE2 connected to the second thin film transistor TFT2.

The first thin film transistor TFT1 includes a first gate electrode GE1, a first semiconductor layer SM1, a first source electrode SE1, and a first drain electrode DE1. The first gate electrode GE1 is protruded from the gate line GL and the first source electrode SE1 is branched from the first data line DL1. The first drain electrode DE1 is spaced apart from the first gate electrode GE1 and the first source electrode SE1 when viewed in a direction perpendicular to the substrate surface (a plan view).

The first pixel electrode PE1 is connected to the first drain electrode DE1 while interposing a protective layer therebetween. The protective layer includes a first contact hole CH1 to expose a portion of the first drain electrode DE1, and the first pixel electrode PE1 makes contact with the portion of the first drain electrode DE1 through the first contact hole CH1.

The second thin film transistor TFT2 includes a second gate electrode GE2, a second semiconductor layer SM2, a second source electrode SE2, and a second drain electrode DE2. The second gate electrode GE2 is protruded from the gate line GL and the second source electrode SE2 is branched from the second data line DL2. The second drain electrode DE2 is spaced apart from the second gate electrode GE2 and the second source electrode SE2 when viewed in a plan view.

The second pixel electrode PE2 is connected to the second drain electrode DE2 while interposing the protective layer therebetween. The protective layer includes a second contact hole CH2 to expose a portion of the second drain electrode DE2, and the second pixel electrode PE2 makes contact with the portion of the second drain electrode DE2 through the second contact hole CH2.

In the thin film transistor substrate according to the fourth exemplary embodiment, the first thin film transistor TFT1 is connected to the gate line GL and the first data line DL1, and the second thin film transistor TFT2 is connected to the gate line GL and the second data line DL2. The shapes of the first pixel electrode PE1 and the second pixel electrode PE2 respectively connected to the first and second thin film transistors TFT1 and TFT2 are different from the pixel electrode PE shown in FIG. 2, but the thin film transistor of the thin film transistor substrate according to the fourth exemplary embodiment has substantially the same structure in comparison with the thin film transistor of the thin film transistor substrate according to the first exemplary embodiment in many aspects.

The display apparatus employing the thin film transistor substrate having according to the fourth exemplary embodiment may apply different image signals to the first and second pixel electrodes PE1 and PE2, thereby broadening a viewing angle. According to exemplary embodiments of the present invention described above, the drain electrode DE is spaced apart from the gate electrode GE when viewed in a plan view; however the present invention is not limited thereto. The position of the drain electrode DE and the position of the source electrode SE may be switched, thus the source electrode SE may be spaced apart from the gate electrode GE when viewed in a plan view.

Figure 13:
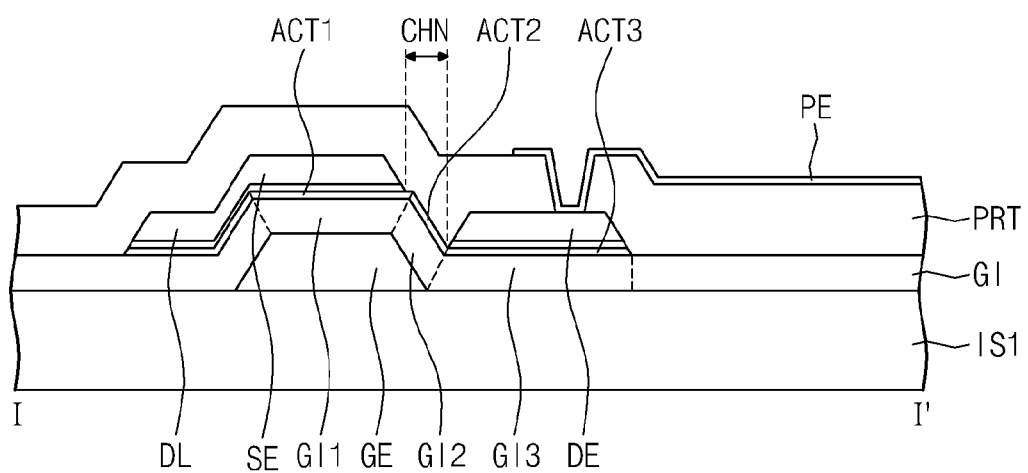
FIG. 13 is a cross-sectional view taken along the line I-I' shown in FIG. 2 according to the first exemplary embodiment of the present invention.

FIG. 13 is a cross-sectional view taken along the line I-I' shown in FIG. 2 according to the first exemplary embodiment of the present invention. Referring to FIG. 3 and FIG. 13, the gate insulating layer GI includes an upper portion GI1, a side portion GI2, and a lower portion GI3. The upper portion GI1 of the gate insulating layer GI is formed on the upper surface of the gate electrode GE, the side portion GI2 of the gate insulating layer GI is formed on the side surface of the gate electrode GE, and the lower portion GI3 is formed on the first insulating substrate IS1. The side portion GI2 connects the upper portion GI1 and the lower portion GI3 and disposed between the upper portion GI1 and the lower portion GI3. The side portion GI2 is inclined with respect to the upper portion GI1 and may be parallel to the side surface of the gate electrode GE. The lower portion GI3 may be located adjacent to the gate electrode GE. The height of the gate electrode GE may be higher than the height of the lower is portion GI3. The upper portion GI1, the side portion GI2, and the lower portion GI3 may have the same thickness.

The active layer ACT includes an upper portion ACT1, a side portion ACT2, and a lower portion ACT3. The upper portion ACT1 is formed on the upper portion GI1 of the gate insulating layer GI, the side portion ACT2 is formed on the side portion GI2 of the gate insulating layer GI, and the lower portion ACT3 is formed on the lower portion GI3 of the gate insulating layer GI. The side portion ACT2 connects the upper portion ACT1 and the lower portion ACT3 and disposed between the upper portion ACT1 and the lower portion ACT3. The side portion ACT2 is inclined with respect to the upper portion ACT1 and may be parallel to the side surface of the gate electrode GE.

Exemplary embodiments of the invention provide a thin film transistor substrate having a reduced parasitic capacitance between gate and source electrodes of a thin film transistor, a reduced kickback voltage and an improved aperture ratio. Accordingly, the display apparatus employing the thin film transistor substrate may have an improved display quality of images. In addition, the thin film transistor substrate may be more efficiently manufactured by using four masks.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor substrate comprising:
   a substrate;
   a gate electrode disposed on a surface of the substrate, the gate electrode comprising a first side surface and a second side surface opposing the first side surface, the second side surface being inclined with respect to the surface of the substrate;
   a gate insulating layer disposed on the gate electrode;
   a semiconductor layer disposed on the gate insulating layer, the semiconductor layer comprising a raised portion, a lower portion, and a slanted portion connecting the raised portion and the lower portion, the slanted portion being disposed closer to the second side surface than the first side surface;
   a first electrode disposed on the lower portion of the semiconductor layer; and
   a second electrode disposed on the raised portion of the semiconductor layer and spaced apart from the first electrode, the second electrode overlapping with a portion of the second side surface when viewed in a direction perpendicular to the surface of the substrate,
   wherein:
      the first electrode is spaced apart from the gate electrode when viewed in the direction perpendicular to the surface of the substrate;
      the second electrode is partially overlapped with the gate electrode when viewed in the direction perpendicular to the surface of the substrate; and
      the slanted portion is exposed from the first electrode and the second electrode.

2. The thin film transistor substrate of claim 1, wherein the first electrode is a source electrode and the second electrode is a drain electrode, or the first electrode is a drain electrode and the second electrode is a source electrode.

3. The thin film transistor substrate of claim 2, wherein the gate electrode is partially overlapped with a portion of the first electrode when viewed in a direction perpendicular to the second side surface.

4. The thin film transistor substrate of claim 3, wherein the overlapped area between the gate electrode and the first electrode has a width less than or equal to about 1 micrometer when viewed in the direction perpendicular to the second side surface.

5. The thin film transistor substrate of claim 1, wherein:
   the gate electrode comprises a first concave portion;
   the semiconductor layer comprises a second concave portion corresponding to the first concave portion; and
   an end portion of the first electrode is disposed in the first concave portion and the second concave portion.

6. A liquid crystal display comprising:
   the thin film transistor substrate of claim 1;
   a pixel electrode connected to the first electrode of the thin film transistor substrate of claim 1;
   a second substrate facing the substrate of the thin film transistor substrate of claim 1 and comprising a common electrode; and
   a liquid crystal layer disposed between the substrate of the thin film transistor substrate of claim 1 and the second substrate.

7. The liquid crystal display of claim 6, wherein the slanted portion is inclined with respect to the raised portion of the semiconductor layer.

8. The liquid crystal display of claim 6, wherein the first electrode is adjacent to one end of the slanted portion of the semiconductor layer and the second electrode is adjacent to the other end of the slanted portion of the semiconductor layer.

9. The liquid crystal display of claim 6, wherein the side surface of the gate electrode is substantially parallel to a surface of the slanted portion of the semiconductor layer.

10. The liquid crystal display of claim 6, further comprising a black matrix disposed between the substrate and the gate electrode, wherein the black matrix covers an area corresponding to the first electrode and the second electrode.

11. The liquid crystal display of claim 6, wherein the substrate further comprises:
   a plurality of gate lines extended in a first direction; and
   a plurality of first data lines extended in a second direction crossing the first direction to define a pixel area with the gate lines.

12. The liquid crystal display of claim 11, wherein the thin film transistor substrate of claim 1 is connected to a corresponding gate line of the gate lines and a corresponding first data line of the first data lines.

13. The liquid crystal display of claim 11, further comprising:
   a plurality of second data lines extended in the second direction and alternately arranged with the first data lines;
   a second thin film transistor disposed in the pixel area and connected to a corresponding gate line of the gate lines and a corresponding second data line of the second data lines; and
   a second pixel electrode connected to the second thin film transistor.

14. The liquid crystal display of claim 13, wherein the second thin film transistor comprises:
   a second gate electrode disposed in the pixel area;
   the gate insulating layer disposed on the second gate electrode;

a second semiconductor layer disposed on the gate insulating layer;
a second source electrode disposed on the second semiconductor layer; and
a second drain electrode disposed on the second semiconductor layer and spaced apart from the second source electrode, wherein
the second pixel electrode is connected to the second drain electrode, and
wherein one of the second source electrode and the second drain electrode is spaced apart from the second gate electrode when viewed in a direction perpendicular to the surface of the substrate of the thin film transistor substrate of claim 1.

* * * * *